United States Patent
Matsuura et al.

(10) Patent No.: US 6,852,571 B2
(45) Date of Patent: Feb. 8, 2005

(54) METHOD OF MANUFACTURING STACKED SEMICONDUCTOR DEVICE

(75) Inventors: Tetsuya Matsuura, Hyogo (JP); Tomoaki Hashimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/654,900

(22) Filed: Sep. 5, 2003

(65) Prior Publication Data

US 2004/0180471 A1 Sep. 16, 2004

(30) Foreign Application Priority Data

Mar. 14, 2003 (JP) ........................................ 2003-069724

(51) Int. Cl.[7] .......................... H01L 21/44; H01L 21/48; H01L 21/50
(52) U.S. Cl. ........................ 438/107; 438/109; 438/112; 438/124; 438/612; 438/617
(58) Field of Search .................. 438/107, 127, 438/109, 112, 124, 126, 618, 617, 666, 110

(56) References Cited

U.S. PATENT DOCUMENTS

| | | | |
|---|---|---|---|
| 6,316,838 B1 * | 11/2001 | Ozawa et al. ................ | 257/778 |
| 6,388,313 B1 * | 5/2002 | Lee et al. .................... | 257/686 |
| 6,407,456 B1 * | 6/2002 | Ball ........................... | 257/777 |
| 6,503,776 B2 * | 1/2003 | Pai et al. .................... | 438/106 |
| 6,593,662 B1 * | 7/2003 | Pu et al. ..................... | 257/777 |
| 6,650,019 B2 * | 11/2003 | Glenn et al. ................. | 257/777 |
| 6,670,701 B2 * | 12/2003 | Matsuura et al. ............ | 257/686 |
| 6,759,307 B1 * | 7/2004 | Yang ........................... | 438/455 |
| 2002/0090753 A1 * | 7/2002 | Pai et al. ..................... | 438/108 |
| 2003/0176018 A1 * | 9/2003 | Derderian ..................... | 438/109 |
| 2004/0009631 A1 * | 1/2004 | Connell et al. .............. | 438/127 |
| 2004/0097017 A1 * | 5/2004 | Shimanuki ................... | 438/124 |
| 2004/0126910 A1 * | 7/2004 | Thomas et al. ............... | 438/15 |
| 2004/0145039 A1 * | 7/2004 | Shim et al ................... | 257/678 |
| 2004/0157375 A1 * | 8/2004 | Derderian ..................... | 438/118 |

FOREIGN PATENT DOCUMENTS

| | | |
|---|---|---|
| JP | 5-29402 | 2/1993 |
| JP | 5-258986 | 10/1993 |
| JP | 2000-216333 A | 8/2000 |
| JP | P2002-231885 A | 8/2002 |

* cited by examiner

*Primary Examiner*—Matthew Smith
*Assistant Examiner*—Chuong Anh Luu
(74) *Attorney, Agent, or Firm*—McDermott, Will & Emery LLP

(57) ABSTRACT

Flux is supplied to the surface of each land by a flux supplying apparatus. A solder ball having a predetermined size is supplied onto a land by using a ball supplying apparatus. A memory IC is disposed on a logic IC and each of a plurality of external leads comes into contact with a predetermined position in each of a plurality of corresponding lands. By performing predetermined heat treatment, the solder ball is melted to bond each external lead and each land with each other. After that, the melted solder is cooled down, the bonded portion is formed, and a stacked semiconductor device in which the memory IC is stacked on the logic IC is completed. In such a manner, a stacked semiconductor device in which external leads of a semiconductor device body are bonded to electrodes on a substrate securely is obtained.

9 Claims, 21 Drawing Sheets

METHOD OF MANUFACTURING STACKED SEMICONDUCTOR DEVICE

BACKGROUND OF THE INVENTION

1. Field of the Invention

The present invention relates to a method of manufacturing a stacked semiconductor device and, particularly, to a method of manufacturing a stacked semiconductor device in which a semiconductor device body such as an IC (Integrated Circuit) is mounted on a substrate.

2. Description of the Background Art

A stacked semiconductor device realizing multiple functions by itself by stacking a plurality of semiconductor device bodies such as ICs of different functions on a substrate and connecting the semiconductor device bodies to each other has been proposed.

An example is a stacked semiconductor device in which a logic IC is mounted as a semiconductor device body in the first stage on a substrate and a memory IC is mounted as a semiconductor device body in the second stage on the logic IC.

In such a stacked semiconductor device, an external lead for the semiconductor device body in the second stage is soldered to a land of the substrate on which the semiconductor device body in the first stage is mounted.

As a conventional method of soldering an external lead for a semiconductor device body to a land, a soldering method disclosed in Japanese Patent Laying-Open No. 5-258986 will be described.

First, a pallet without a solder chip in which an initial semiconductor device body on which a solder chip is not yet applied is housed is prepared. On the other hand, a pallet with a chip having a groove in which a solder paste is to be applied is prepared.

A solder paste is applied on the pallet with the chip. The groove is filled with the applied solder paste with a squeegee.

Subsequently, the semiconductor device body is taken out from the pallet without a solder chip. The taken semiconductor device body is mounted on the pallet with the chip so that the outer lead of the semiconductor device body is positioned on the groove of the pallet with the chip.

In a state where the semiconductor device body is mounted on the pallet with the chip, the pallet with the chip is heated to a predetermined temperature. The semiconductor device body is pressed and the external lead enters the solder paste.

The solder paste is heated to thereby become a solder metal and is adhered to the external lead. The semiconductor device body to which the solder is supplied to the external lead is soldered to a predetermined substrate and is mounted.

However, the conventional method has the following problems. As described above, the solder is supplied to the external lead of the semiconductor device body by pushing the external lead into the solder filled in the groove in the pallet with the chip.

At the time of bringing the semiconductor device body up, the solder filled in the groove is attached to the external lead by an adhesion force to the external lead. At this time, depending on the way of pushing the external lead into the solder, the adhesion force of the solder to the external lead varies and, there is a case that the amount of solder adhered to the external lead becomes uniform.

Consequently, for example, at the time of bonding the external lead of the semiconductor device body in the second stage to the land, soldering is not conducted securely, and there is a case that the semiconductor device in the first stage and the semiconductor device in the second stage are not electrically connected excellently. As a result, a problem such that a desired function of the semiconductor device cannot be assured might occur.

SUMMARY OF THE INVENTION

The present invention has been achieved to solve the problems and its object is to provide a method of manufacturing a stacked semiconductor device in which an external lead of a semiconductor device body and a land of a substrate are bonded to each other securely.

According to the present invention, there is provided a method of manufacturing a stacked semiconductor device in which a plurality of semiconductor device bodies each having a predetermined function are stacked on a main surface of a substrate. The method has the steps of: forming a semiconductor device body on a main surface of a substrate; forming a plurality of electrodes to be electrically connected to the semiconductor device body on the surface of portions in the substrate positioned around the semiconductor device body; supplying a solder ball of a predetermined size to each of the plurality of electrodes; preparing another semiconductor device body having a plurality of external leads to be bonded to the plurality of electrodes; supplying flux to either the plurality of external leads of the another semiconductor device body or the plurality of electrodes; after the flux is supplied, disposing the another semiconductor device body on the semiconductor device body and making each of the plurality of electrodes to which the solder balls are supplied come into contact with each of the plurality of corresponding external leads; and performing predetermined heat treatment in a state where the plurality of electrodes and the plurality of external leads are in contact with each other to melt the solder balls, thereby bonding each of the plurality of electrodes with each of the plurality of electrodes.

With such a manufacturing method, a solder ball of a predetermined size is supplied to each of a plurality of electrodes. Consequently, solder of a predetermined amount is supplied to each of the plurality of electrodes with reliability. As a result, by performing predetermined heat treatment to melt the solder ball positioned on each electrode, each of the electrodes electrically connected to the semiconductor device body and each of external leads of another semiconductor device body can be bonded securely to each other.

According to the present invention, there is also provided a method of manufacturing a stacked semiconductor device in which a plurality of semiconductor device bodies each having a predetermined function are stacked on the main surface of a substrate, including the steps of: forming a semiconductor device body on the main surface of the substrate; forming a plurality of electrodes electrically connected to the semiconductor device body on the surface of a part in the substrate positioned around the semiconductor device body; preparing another semiconductor device body having a plurality of external leads bonded to the plurality of electrodes; supplying a solder paste of a predetermined amount corresponding to a predetermined thickness of a predetermined mask member via the predetermined mask member corresponding to dimensions of the external lead to each of the plurality of external leads in the another semiconductor device body; after the solder paste is supplied, disposing the another semiconductor device body on the semiconductor device body and making each of the plurality of external leads to which the solder paste is supplied come into contact with each of the plurality of corresponding electrodes; and performing predetermined heat treatment in a state where the plurality of electrodes and the plurality of external leads are in contact with each other to melt the solder paste, thereby bonding each of the plurality of electrodes to each of the plurality of corresponding electrodes.

With such a manufacturing method, solder paste of a predetermined amount corresponding to the thickness of a predetermined mask member is supplied via the mask member corresponding to the dimensions of an external lead to each of a plurality of external leads of another semiconductor device. With the configuration, solder of a predetermined amount is reliably supplied to each of the plurality of external leads in the another semiconductor device body. As a result, by performing predetermined heat treatment to melt the solder paste, each of electrodes electrically connected to the semiconductor device body and each of the external leads of another semiconductor device body can be bonded securely to each other.

According to the present invention, there is also provided a method of manufacturing a stacked semiconductor device in which a plurality of semiconductor device bodies each having a predetermined function are stacked on the main surface of a substrate, including the steps of: forming a semiconductor device body on the main surface of the substrate; forming a plurality of electrodes electrically connected to the semiconductor device body on the surface of a part of the substrate positioned around the semiconductor device body; forming a solder plating layer having a predetermined thickness on each of the plurality of electrodes; preparing another semiconductor device body having a plurality of external leads bonded to the plurality of electrodes; supplying flux to either the plurality of external leads or the plurality of electrodes in the another semiconductor device body; after the flux is supplied, disposing the another semiconductor device body on the semiconductor device body and making each of the plurality of corresponding external leads come into contact with each of the plurality of electrodes on each of which the solder plating layer is formed; and performing predetermined heat treatment in a state where the plurality of electrodes and the plurality of external leads are in contact with each other to melt the solder plating layer, thereby bonding each of the plurality of electrodes to each of the plurality of corresponding electrodes.

With such a manufacturing method, a solder plating layer having a predetermined thickness is formed on each of a plurality of electrodes. With the configuration, solder of a predetermined amount is supplied reliably to each of the plurality of electrodes. As a result, by performing predetermined heat treatment to melt the solder plating layer formed on each of the electrodes, each of the electrodes electrically connected to the semiconductor device body and each of the external leads of another semiconductor device body can be bonded to each other securely.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view showing the process in FIG. 6 in the first embodiment;

FIG. 8 is a cross section showing a process performed after the process of FIG. 6 in the first embodiment;

DESCRIPTION OF THE PREFERRED EMBODIMENTS

First Embodiment

A method of manufacturing a stacked semiconductor device according to a first embodiment of the present invention will be described.

Figure 1:
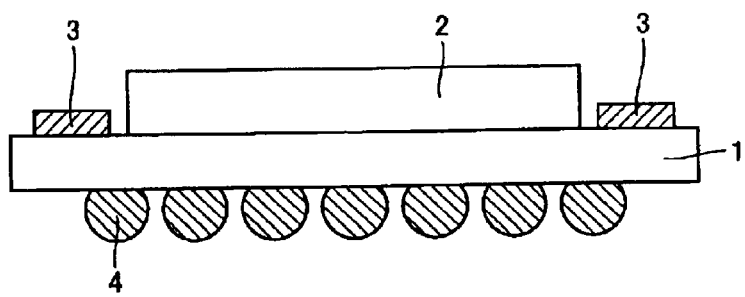
FIG. 1 is a cross section showing a process in a method of manufacturing a semiconductor device according to a first embodiment of the present invention.
Figure 2:
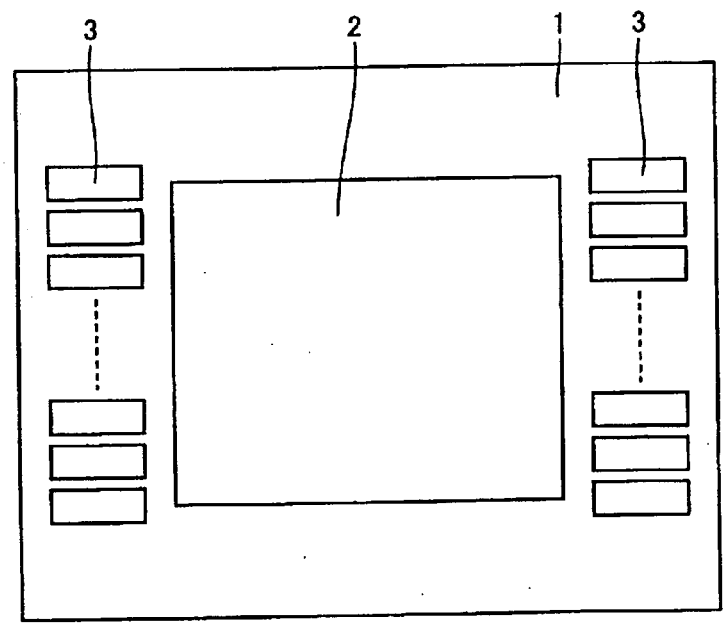
FIG. 2 is a plan view in the process shown in FIG. 1 in the first embodiment.

As shown in FIGS. 1 and 2, first, as a semiconductor device body in the first stage, for example, a logic IC 2 is formed on the surface of a predetermined substrate 1. Around logic IC 2, a plurality of lands 3 serving as electrodes are regularly formed.

Logic IC 2 is electrically connected to lands 3. As a form of the stacked semiconductor device, a plurality of solder balls (ball grid array type) 4 are formed on the under face of substrate 1.

Figure 3:
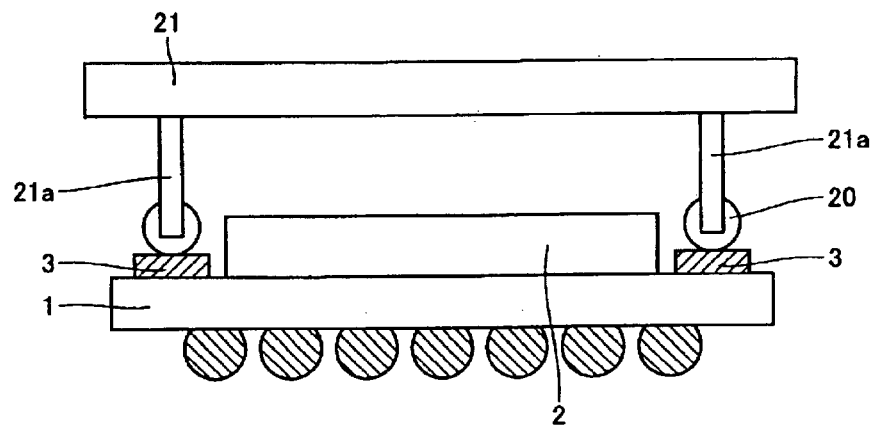
FIG. 3 is a cross section showing a process performed after the process illustrated in FIG. 1 in the first embodiment.
Figure 4:
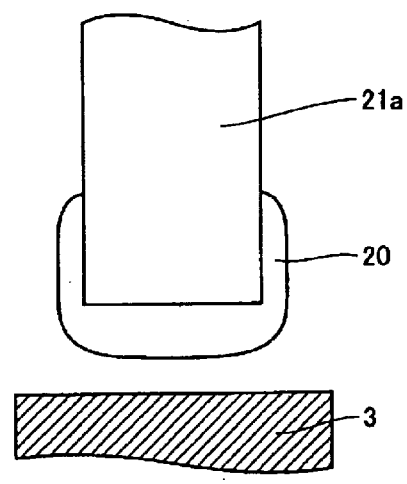
FIG. 4 is a partly enlarged cross section in the process shown in FIG. 3 in the first embodiment.

As shown in FIG. 3, a flux 20 is supplied to the surface of each of lands 3 from a flux supplying apparatus 21. At this time, as shown in FIG. 4, flux 20 is supplied by transfer from a tip portion 21a of flux supplying apparatus 21 to the surface of land 3.

Figure 5:
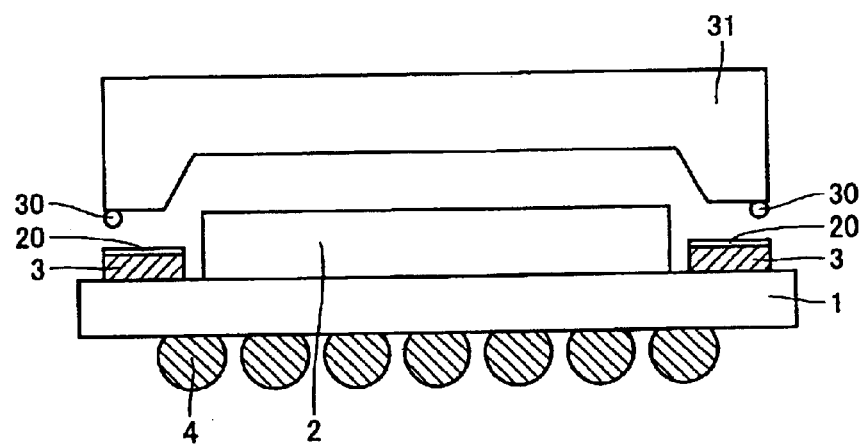
FIG. 5 is a cross section showing a process performed after the process illustrated in FIG. 3 in the first embodiment.

Subsequently, as shown in FIG. 5, solder balls 30 each having a predetermined size are supplied onto lands 3 by using a ball supplying apparatus 31. The diameter of each solder ball 30 is, for example, about 0.20 to 0.50 mm. As solder, for example, Sn—Pb eutectic (having a melting point of 183° C.), Pb free solder (Sn.3Ag.0.5Cu, having a melting point of 218° C.), or the like is used.

Solder balls 30 come into contact with lands 3 in a state where they are vacuum-absorbed by the tip portions of ball supplying apparatus 31. After that, the vacuum absorption is canceled and solder balls 30 are placed onto the surface of lands 3. Solder balls 30 placed on the surface of lands 3 do not easily move because of viscosity of flux 20.

Figure 6:
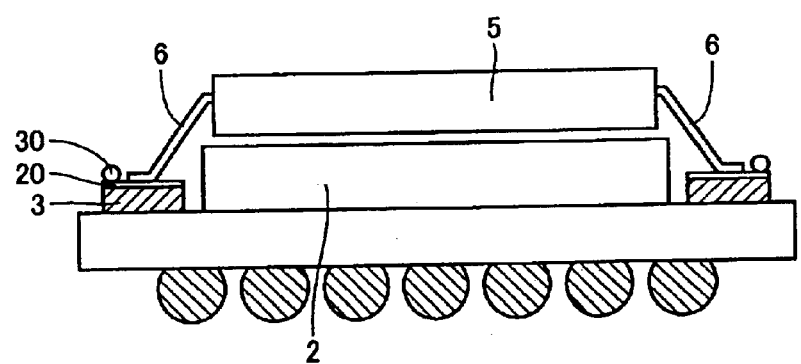
FIG. 6 is a cross section showing a process performed after the process illustrated in FIG. 5 in the first embodiment.

As shown in FIG. 6, as a semiconductor device body in the second stage, for example, a memory IC 5 is disposed on logic IC 2 in the first stage. At this time, each of a plurality of external leads 6 provided for memory IC 5 comes into contact with a predetermined position in each of the plurality of corresponding lands 3.

In this case for example, as shown in FIG. 7, external leads 6 of memory IC 5 are in contact with the side of memory IC 5 of lands 3. Solder balls 30 are disposed on the side opposite to the side where memory IC 5 is positioned.

Subsequently, by performing predetermined heat treatment at a temperature higher than the melting point of solder, solder balls 30 are melted and external leads 6 of memory IC 5 and lands 3 are bonded to each other.

After that, the melted solder is cooled down and bonded portions 7 are formed. As shown in FIG. 8, the stacked semiconductor device in which memory IC 5 is stacked on logic IC 2 is completed.

In the method of manufacturing the stacked semiconductor device, solder ball 30 having a predetermined size is supplied to each of the plurality of lands 3. Consequently, the solder of a predetermined amount is supplied to each of the plurality of lands 3 with reliability.

As a result, predetermined heat treatment is performed to melt solder balls 30 positioned on lands 3, thereby enabling external leads 6 of memory IC 5 and lands 3 to be bonded securely.

Second Embodiment

In the foregoing manufacturing method, the case of supplying one solder ball 30 to each land 3 has been described as an example. A case of supplying two solder balls to each land will now be described as an example.

Figure 9:
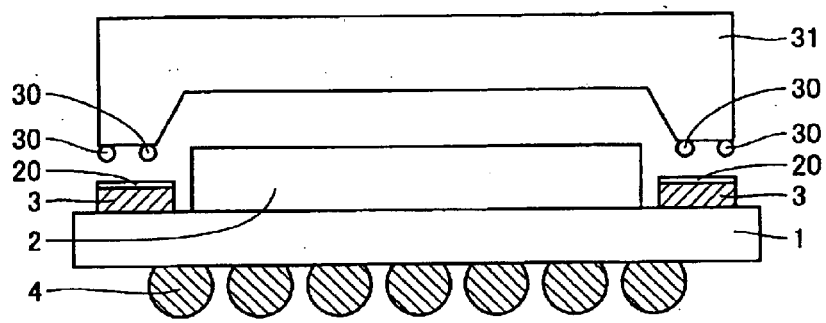
FIG. 9 is a cross section showing a process in a method of manufacturing a semiconductor device according to a second embodiment of the present invention.
Figure 10:
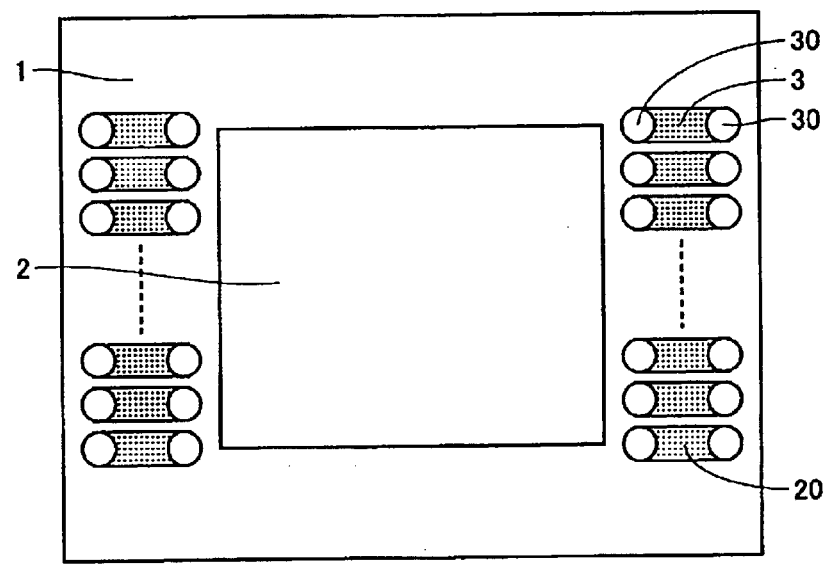
FIG. 10 is a plan view showing the process of FIG. 9 in the second embodiment.

First, after the process of applying the flux shown in FIG. 3, as shown in FIGS. 9 and 10, two solder balls 30 are supplied to each land 3 by ball supplying apparatus 31.

In this case, for example, as shown in FIG. 10, one of solder balls 30 is supplied to the side of logic IC 2 in land 3, and the other solder ball 30 is supplied to the side opposite to the side where logic IC 2 is positioned. Each of solder balls 30 disposed on lands 3 does not easily move because of viscosity of flux 20.

Figure 11:
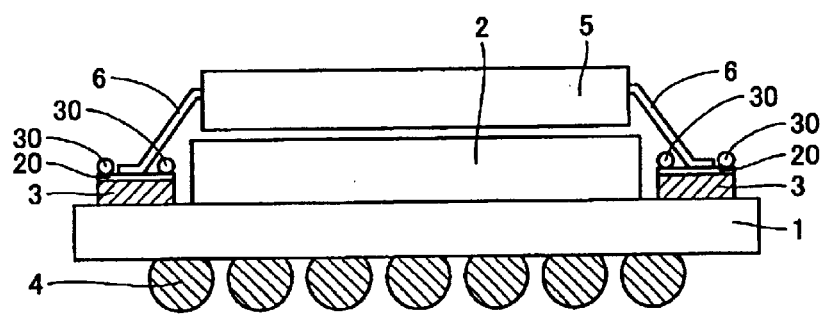
FIG. 11 is a cross section showing a process performed after the process of FIG. 9 in the second embodiment.
Figure 9:
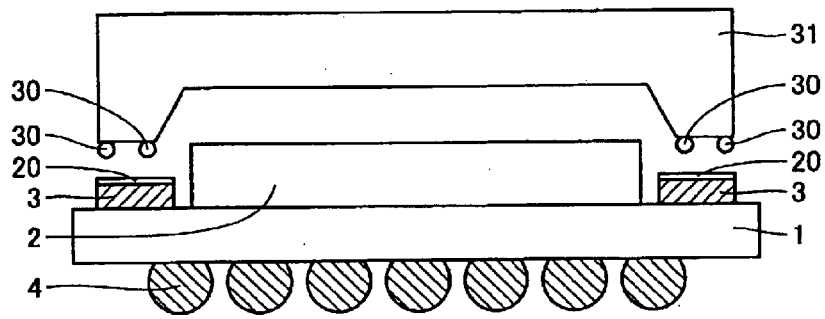
Figure 10:
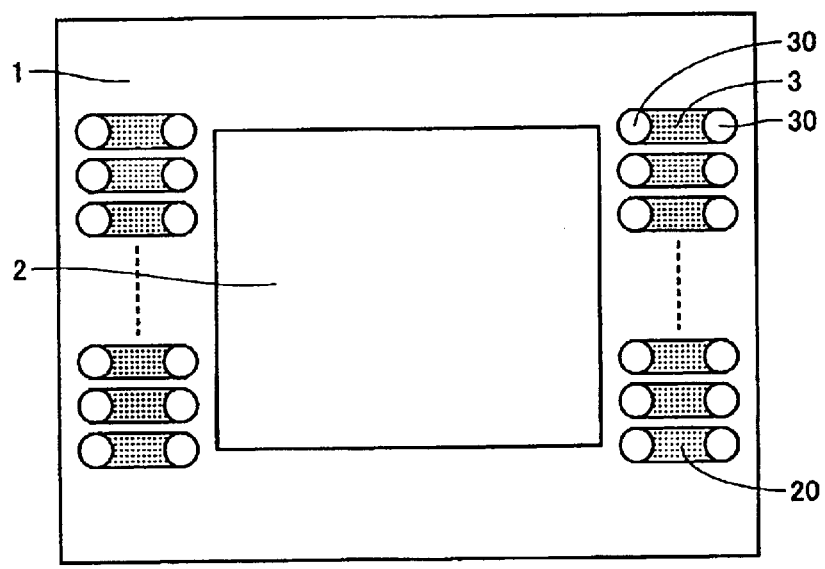
Figure 11:
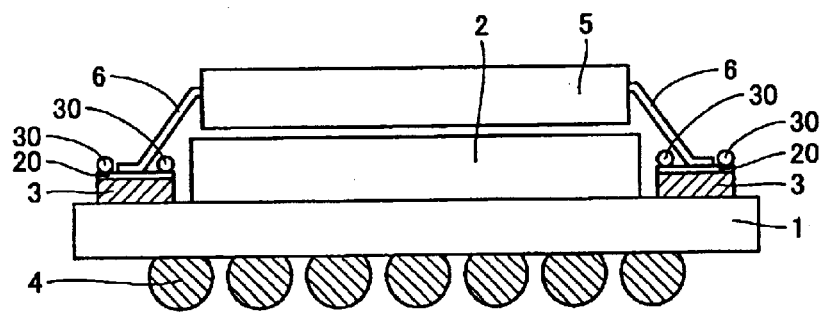

As shown in FIG. 11, memory IC 5 is disposed on logic IC 2 of the first stage. At this time, the plurality of external leads 6 provided for memory IC 5 come into contact with predetermined positions in the plurality of corresponding lands 3.

In this case, each external lead 6 comes into contact with the position between one of solder balls 30 and the other solder ball 30 in each land 3.

By performing predetermined heat treatment at a temperature higher than the melting point of the solder, solder balls 30 are melted and external leads 6 of memory IC 5 and lands 3 are bonded to each other. After that, the melted solder is cooled down and the stacked semiconductor device in which memory IC 5 is stacked on logic IC 2 is completed (for example, see FIG. 34 to be described later).

In the method of manufacturing the stacked semiconductor device, two solder balls 30 each having predetermined size are supplied to each of the plurality of lands 3. Consequently, solder of a predetermined amount is sufficiently supplied to each of the plurality of lands 3.

As a result, by performing predetermined heat treatment to melt solder balls 30 positioned on lands 3, each external lead 6 of memory IC 5 and each land 3 can be bonded to each other more securely.

Third Embodiment

A case of providing a groove for receiving a solder ball in each land will be described as an example.

Figure 12:
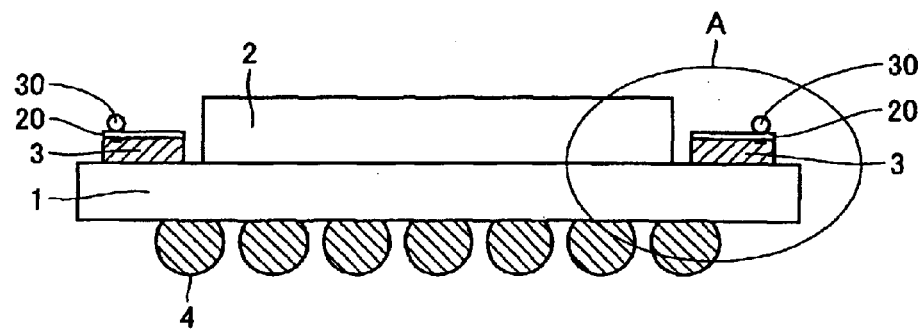
FIG. 12 is a cross section showing a process in a method of manufacturing a semiconductor device according to a third embodiment of the present invention.
Figure 13:
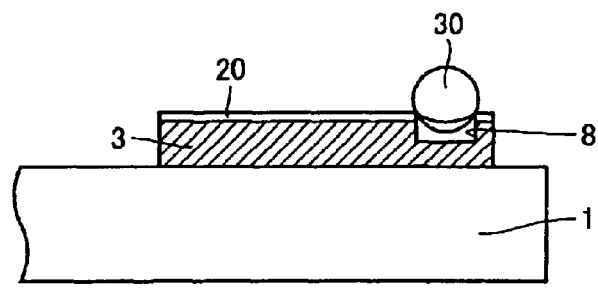
FIG. 13 is a partly enlarged cross section in a frame A in the process of FIG. 12 in the third embodiment.

First, after the process of applying the flux shown in FIG. 3, solder balls 30 are supplied to lands from the ball supplying apparatus as shown in FIG. 12. As shown in FIG. 13, a recess 8 is preliminarily formed in land 3. Solder ball 30 is placed on recess 8 so as to be received by recess 8.

Figure 14:
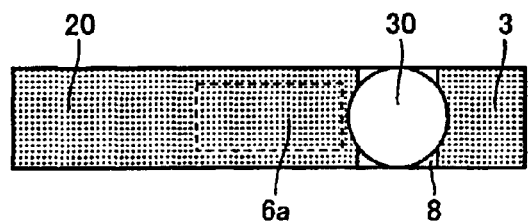
FIG. 14 is a partly enlarged plan view in the frame A in the process shown in FIG. 12 in the third embodiment.

As shown in FIG. 14, in a predetermined position 6a in each of the plurality of corresponding lands 3, each of the plurality of external leads provided for the memory IC in the second stage comes into contact.

By performing predetermined heat treatment at a temperature higher than the melting point of solder, solder ball 30 is melted and external lead 6 of memory IC 5 and land 3 are bonded to each other. After that, the melted solder is cooled down, and the stacked semiconductor device in which memory IC 5 is stacked on logic IC 2 is completed (for example, see FIG. 8).

In the method of manufacturing the stacked semiconductor device, recess 8 for receiving solder ball 30 is formed in each of the plurality of lands 3 to which solder balls 30 are supplied.

With the configuration, even if flux 20 flows at the time of performing the predetermined heat treatment to melt solder balls 30, solder balls 30 are not flowed together from predetermined lands 3.

As a result, the solder ball is melted reliably on predetermined land 3, so that external leads 6 of memory IC 5 and lands 3 can be bonded to each other more reliably.

Fourth Embodiment

The case where one solder ball 30 is supplied to each land 3 has been described as an example in the third embodiment. A case of supplying two solder balls to each land will now be described as an example.

Figure 15:
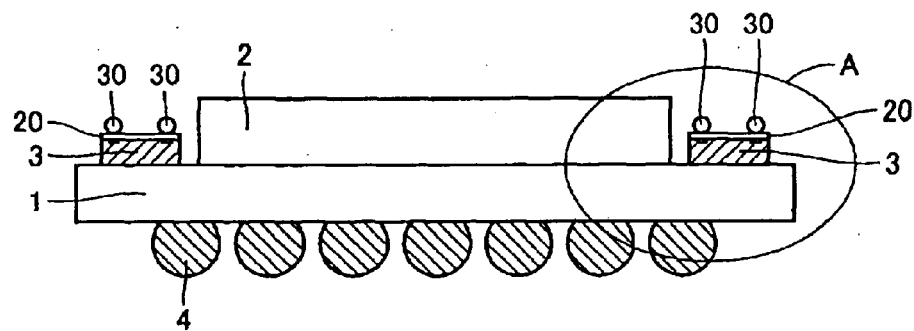
FIG. 15 is a cross section showing a process in a method of manufacturing a semiconductor device according to a fourth embodiment of the present invention.

First, after the process of applying the flux shown in FIG. 3, as shown in FIG. 15, two solder balls 30 are supplied to each land 3 from the ball supplying apparatus.

Figure 16:
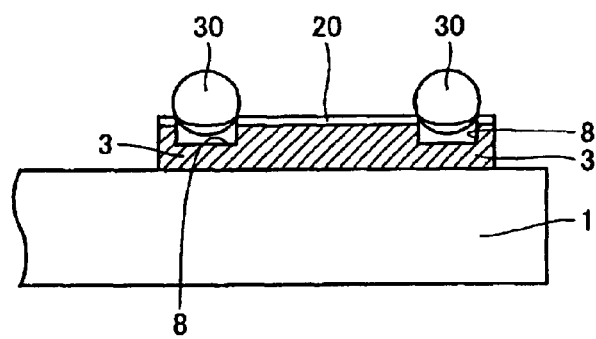
FIG. 16 is a partly enlarged cross section in the frame A in the process shown in FIG. 15 in the fourth embodiment.

As shown in FIG. 16, two recesses 8 are formed in land 3. One of recesses 8 is formed on the side of the memory IC and the other recess 8 is formed on the side opposite to the side of the memory IC.

One of solder balls 30 is disposed on one of recesses 8 and the other solder ball 30 is placed on the other recess 8.

Figure 17:
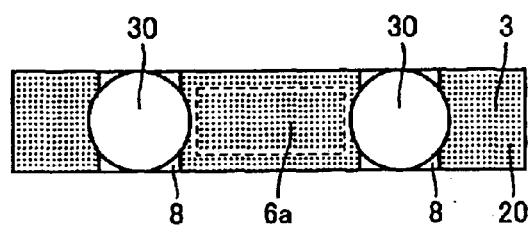
FIG. 17 is a partly enlarged plan view in the frame A in the process shown in FIG. 15 in the fourth embodiment.

As shown in FIG. 17, each of the plurality of external leads provided for the memory IC in the second stage comes into contact with predetermined position 6a in each of the plurality of lands 3.

Subsequently, by performing predetermined heat treatment at a temperature higher than the melting point of the solder, solder balls 30 are melted to bond external leads 6 of memory IC 5 and lands 3 to each other. After that, the melted solder is cooled down, and the stacked semiconductor device in which memory IC 5 is stacked on logic IC 2 is completed (for example, see FIG. 34).

In the method of manufacturing the stacked semiconductor device, in each of the plurality of lands 3 to which solder balls 30 are supplied, two recesses 8 for receiving solder balls 30 are formed.

With the configuration, even if flux 20 flows at the time of performing predetermined heat treatment to melt solder balls 30, solder balls 30 are not accordingly flowed from predetermined lands 3.

Two solder balls 30 each having predetermined size are supplied to each of the plurality of lands 3. Consequently, to each of the plurality of lands 3, solder of a predetermined amount is sufficiently supplied.

As a result, the solder balls are melted reliably on predetermined lands 3 and external leads 6 of memory IC 5 and lands 3 can be bonded to each other more securely.

Fifth Embodiment

A case of supplying flux in a predetermined pattern to each land will be described as an example.

Figure 18:
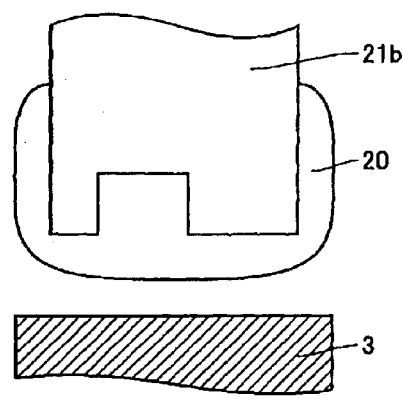
FIG. 18 is a partly enlarged cross section showing a process in a method of manufacturing a semiconductor device according to a fifth embodiment of the present invention.

First, flux is supplied to the surface of each land by the flux supplying apparatus. At this time, as shown in FIG. 18, flux 20 is supplied by transfer from a forked tip portion 21bs of the flux supplying apparatus to the surface of land 3.

Figure 19:
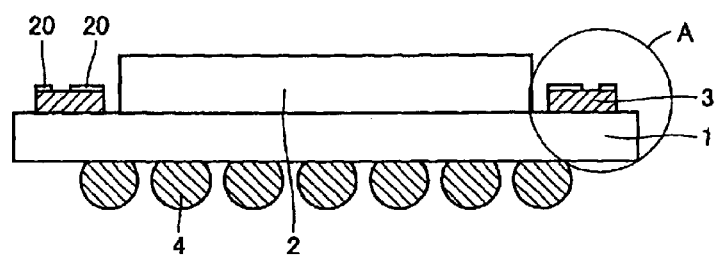
FIG. 19 is a cross section showing a process performed after the process illustrated in FIG. 18 in the fifth embodiment.
Figure 20:
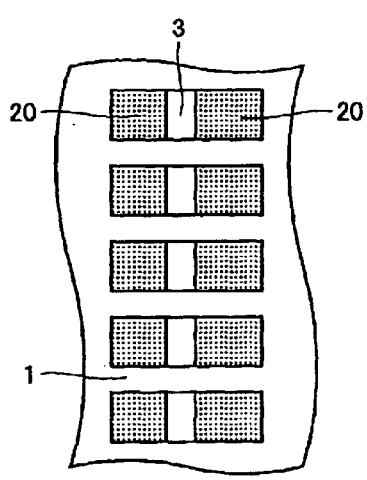
FIG. 20 is a partial plan view in the frame A in the process shown in FIG. 19 in the fifth embodiment.

By the operation, as shown in FIGS. 19 and 20, flux 20 is supplied to the side of the memory IC in land 3, and another flux 20 is supplied to the side opposite to the side of the memory IC. In the center portion of land 3, no flux is supplied.

Figure 21:
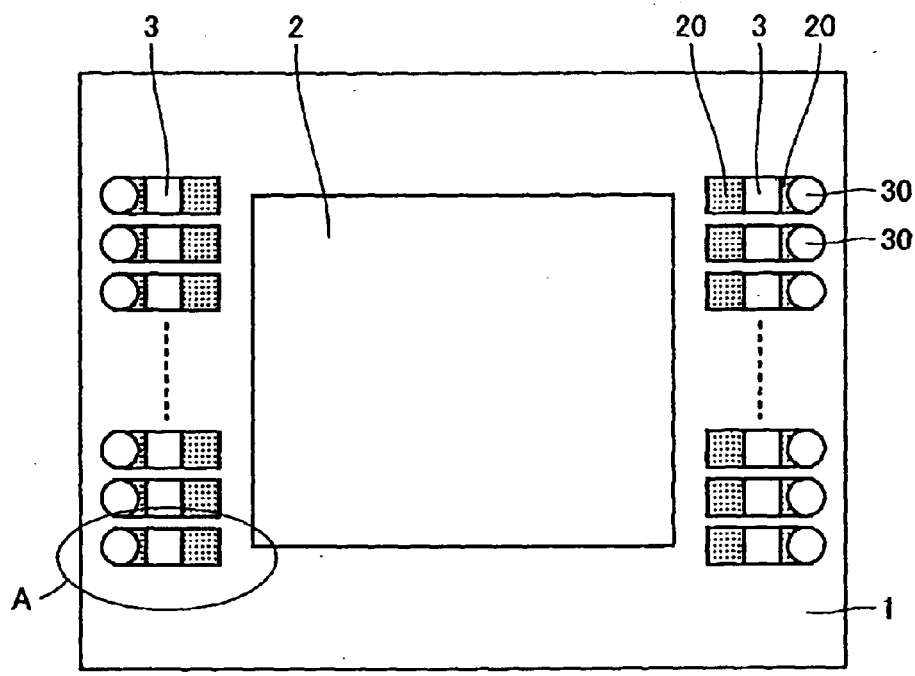
FIG. 21 is a plan view showing a process performed after the process illustrated in FIG. 19 in the fifth embodiment.

Subsequently, as shown in FIG. 21, solder balls 30 are supplied to predetermined positions in lands 3 by the ball supplying apparatus. For example, in this case, each solder ball 30 is supplied onto flux 20 positioned on the side opposite to the side of memory IC in land 3.

Figure 22:
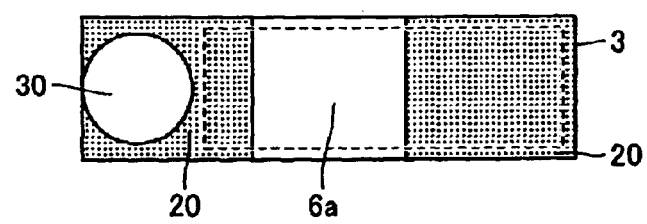
FIG. 22 is a partly enlarged plan view of the frame A in the process shown in FIG. 21 in the fifth embodiment.

As shown in FIG. 22, to predetermined position 6a in each of the plurality of lands 3, each of the plurality of external leads provided for the memory IC in the second stage comes into contact. The external lead is in contact so as to continuously cover both the portion to which one flux 20 is supplied and the portion to which the other flux 20 is supplied.

By performing predetermined heat treatment at a temperature higher than the melting point of solder, solder balls 30 are melted to bond external leads 6 of memory IC 5 and lands 3. After that, the melted solder is cooled down, and the stacked semiconductor device in which memory IC 5 is stacked on logic IC 2 is completed (see, for example, FIG. 8).

In the method of manufacturing the stacked semiconductor device, flux 20 is supplied to the portion on the side of the memory IC of land 3 and the portion on the other side but is not supplied to the center portion.

With the configuration, as compared with the case where flux 20 is supplied to the whole face of land 3, the following effects are obtained.

At the time of performing predetermined heat treatment to melt solder balls 30, it is expected that flux 20 flows.

Figure 23:
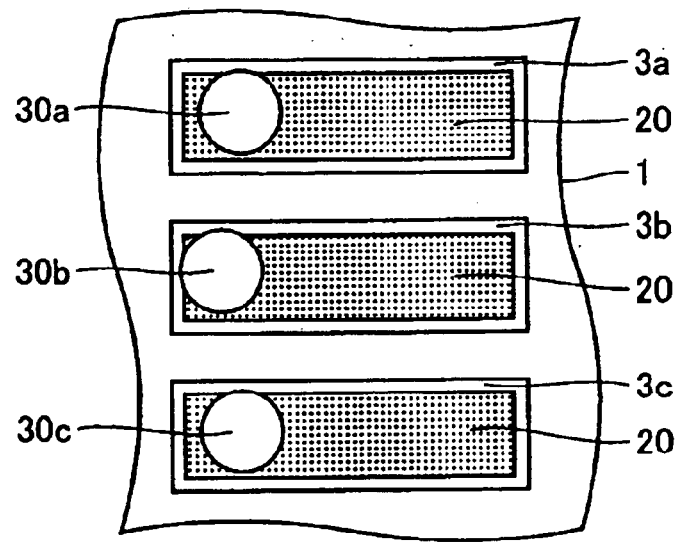
FIG. 23 is a first partly enlarged plan view to be compared for describing effects in the fifth embodiment.
Figure 24:
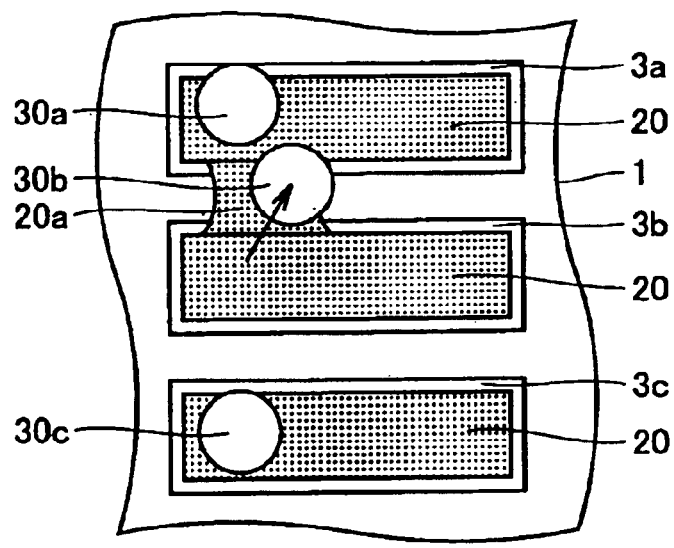
FIG. 24 is a second partly enlarged plan view to be compared for describing effects in the fifth embodiment.

As shown in FIG. 23, when flux 20 is supplied to the whole face of each of the plurality of lands 3a to 3c, for example as shown in FIG. 24, there is the possibility that flux 20 supplied to land 3*b* flows out and merges with flux 20 supplied to the neighboring land 3*a*.

Due to this, it is feared that solder ball 30*b* supplied onto land 3*b* moves to land 3*a* with flow of flux 20 and no solder ball is supplied to land 3*b*.

Figure 25:
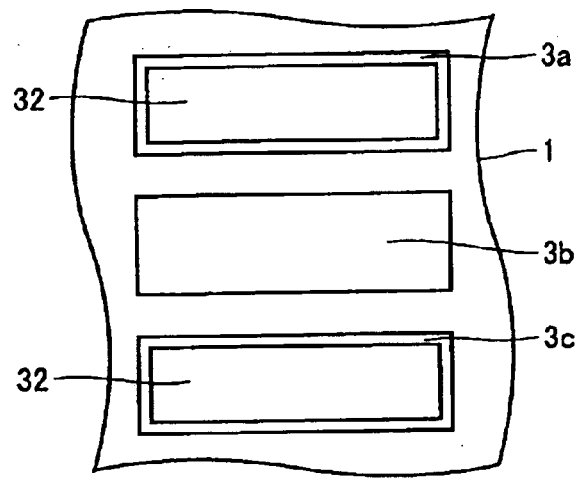
FIG. 25 is a third partly enlarged plan view to be compared for describing effects in the fifth embodiment.

When solder balls 30*a* to 30*c* are melted in the state, as shown in FIG. 25, solder 32 is formed only on lands 3*a* and 3*c* and is hardly formed on land 3*b*. As a result, bonding between land 3*b* and the corresponding external lead becomes insufficient.

On the other hand, in the above-described method, flux 20 is supplied only to the portion necessary to bond land 3 and the external lead in land 3 and is not supplied to the other portion.

It prevents a situation such that flux 20 supplied to one land 3 flows out to the neighboring land 3, solder ball 30 supplied to land 3*b* moves to neighboring land 3, and no solder ball is supplied to the one land 3.

As a result, a land 3 and a corresponding external lead can be prevented from being insufficiently bonded but can be bonded to each other securely.

Sixth Embodiment

A case of supplying flux to a solder ball and also to an external lead will be described as an example.

Figure 26:
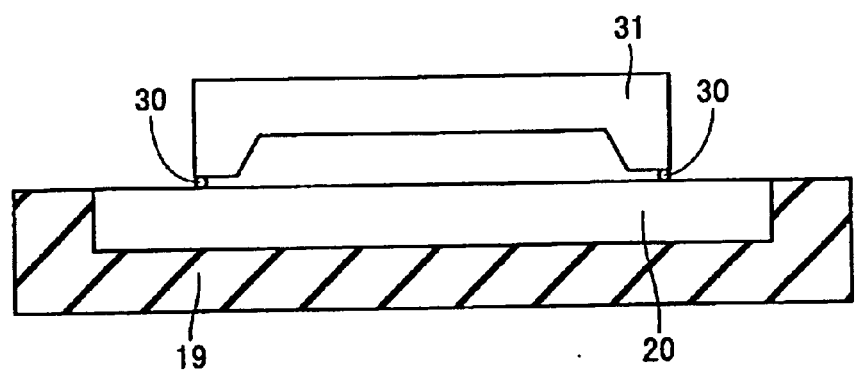
FIG. 26 is a cross section showing a process in a method of manufacturing a semiconductor device according to a sixth embodiment of the present invention.
Figure 27:
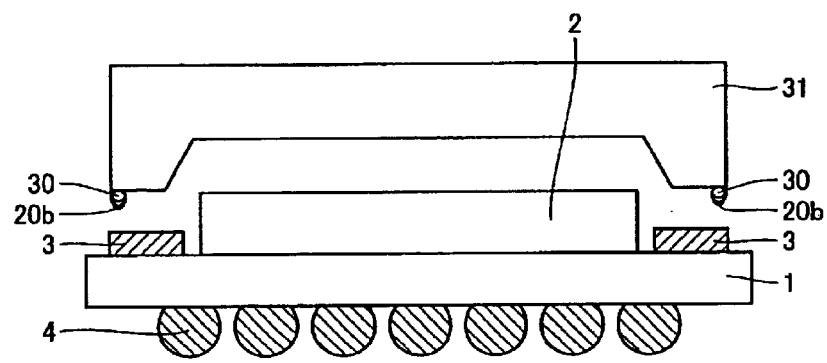
FIG. 27 is a cross section showing a process performed after the process illustrated in FIG. 26 in the sixth embodiment.

First, as shown in FIG. 26, by making solder balls 30 each having a predetermined size supplied by ball supplying apparatus 31 come into contact with flux 20 in a vessel 19, as shown in FIG. 27, a flux 20*b* is supplied to the under face of each of solder balls 30. After that, solder balls 30 to which flux 20*b* is supplied are supplied to lands 3.

Figure 28:
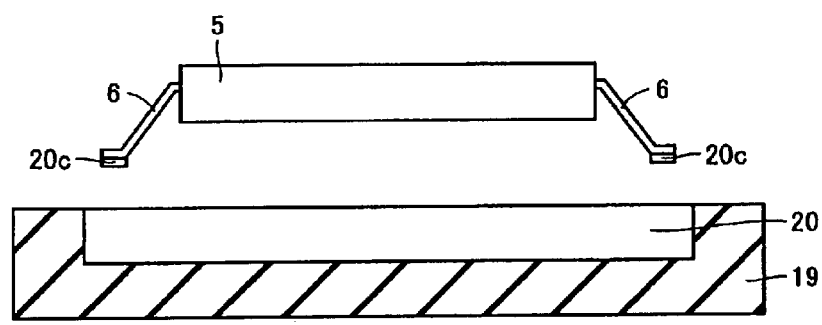
FIG. 28 is a cross section showing a process performed after the process illustrated in FIG. 27 in the sixth embodiment.

On the other hand, as shown in FIG. 28, by making external leads 6 of memory IC 5 in the second stage come into contact with flux 20 in vessel 19, a flux 20*c* is supplied to a portion (contact face) in contact with land 3 in each external lead 6.

Figure 29:
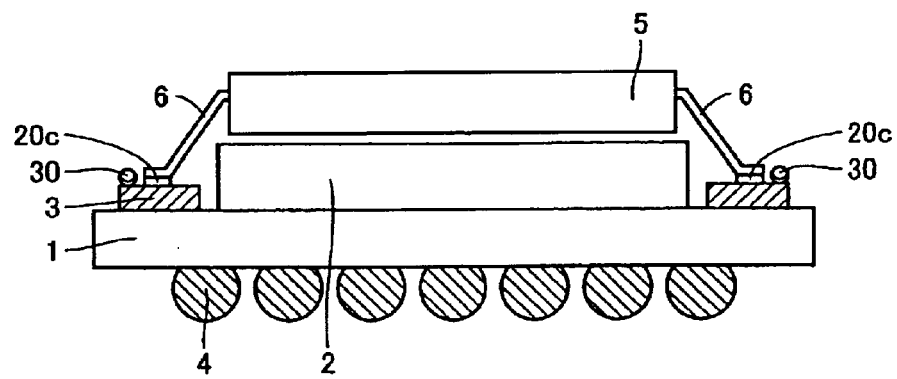
FIG. 29 is a cross section showing a process performed after the process illustrated in FIG. 28 in the sixth embodiment.

As shown in FIG. 29, memory IC 5 having external leads 6 to which flux 20*c* is supplied is mounted on logic IC 2 in the first stage, and each of the plurality of external leads 6 comes into contact with the predetermined position in each of the plurality of lands 3.

By performing predetermined heat treatment at a temperature higher than the melting point of the solder, solder ball 30 is melted to bond each of external leads 6 of memory IC 5 and each land 3 to each other.

Figure 30:
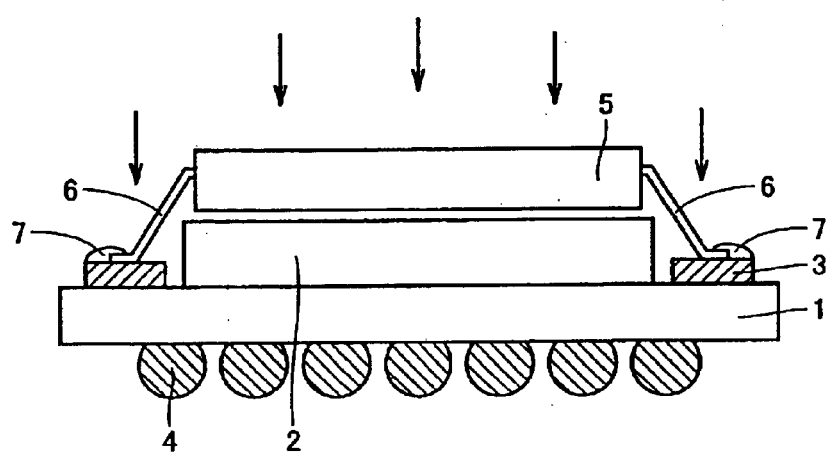
FIG. 30 is a cross section showing a process performed after the process illustrated in FIG. 29 in the sixth embodiment.

After that, the melted solder is cooled down, thereby forming a bonded portion 7 and, as shown in FIG. 30, the stacked semiconductor device in which memory IC 5 is stacked on logic IC 2 is completed.

In the method of manufacturing the stacked semiconductor device, fluxes 20*b* and 20*a* are supplied only to the portions which come into contact with lands 3 in solder balls 30 and external leads 6 of the memory IC.

At the time of performing predetermined heat treatment to melt solder balls 30, flux 20 is suppressed from flowing from one land to another land.

As a result, solder balls of a predetermined amount are melted reliably on lands 3 so that external leads 6 of memory IC 5 and lands 3 can be bonded to each other more reliably.

Seventh Embodiment

The case of supplying one solder ball 30 to each land 3 has been described as an example in the sixth embodiment. A case of supplying two solder balls to each land will now be described as an example.

Figure 31:
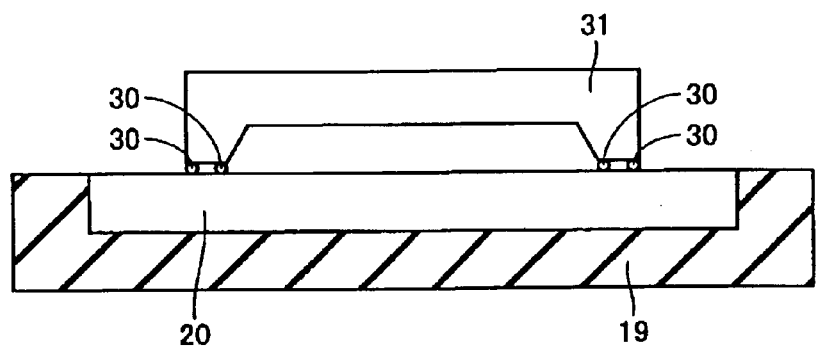
FIG. 31 is a cross section showing a process in a method of manufacturing a semiconductor device according to a seventh embodiment of the present invention.
Figure 32:
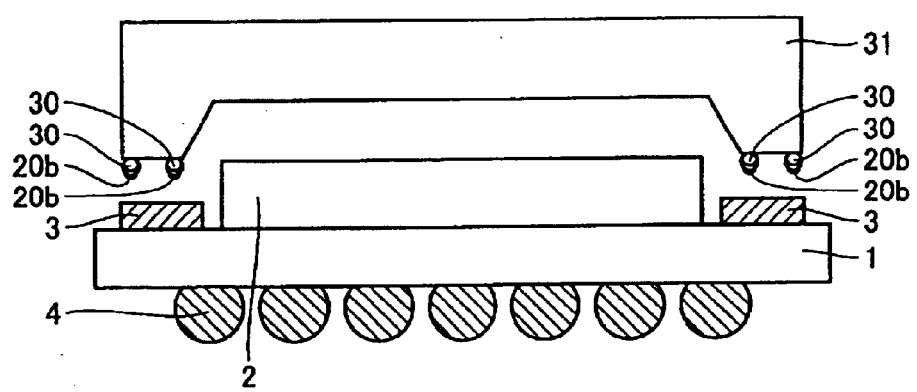
FIG. 32 is a cross section showing a process performed after the process illustrated in FIG. 31 in the seventh embodiment.

First, by making solder balls 30 each having a predetermined size supplied by ball supplying apparatus 31 come into contact with flux 20 in vessel 19 as shown in FIG. 31, flux 20*b* is supplied to the under surface of each solder ball 30 as shown in FIG. 32. Subsequently, two solder balls 30 to which flux 20*b* is supplied are supplied to lands 3.

On the other hand, in a manner similar to the process shown in FIG. 28, by making external leads 6 of memory IC 5 in the second stage come into contact with flux 20 in vessel 19, flux 20*c* is supplied to the contact face which comes into contact with land 3 in each external lead 6.

Figure 33:
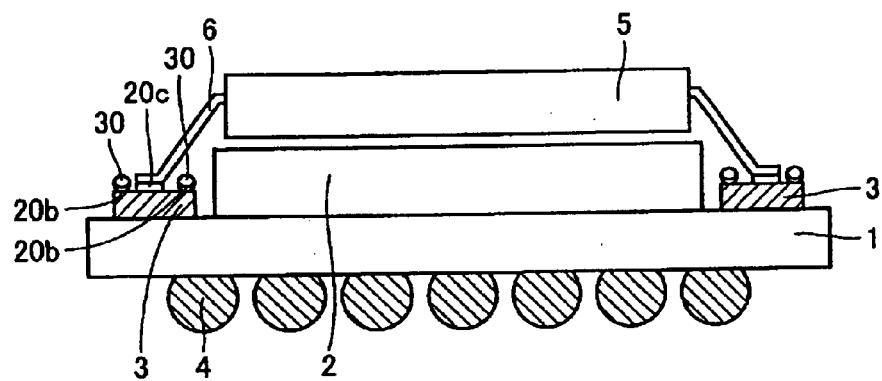
FIG. 33 is a cross section showing a process performed after the process illustrated in FIG. 32 in the seventh embodiment.

As shown in FIG. 33, memory IC 5 having external leads 6 to which flux 20*c* is supplied is mounted on logic IC 2 in the first stage and each of the plurality of external leads 6 comes into contact with the predetermined position in each of the plurality of corresponding lands 3.

By performing predetermined heat treatment at a temperature higher than the melting point of the solder, solder balls 30 are melted, thereby bonding external leads 6 of memory IC 5 and lands 3 to each other.

Figure 34:
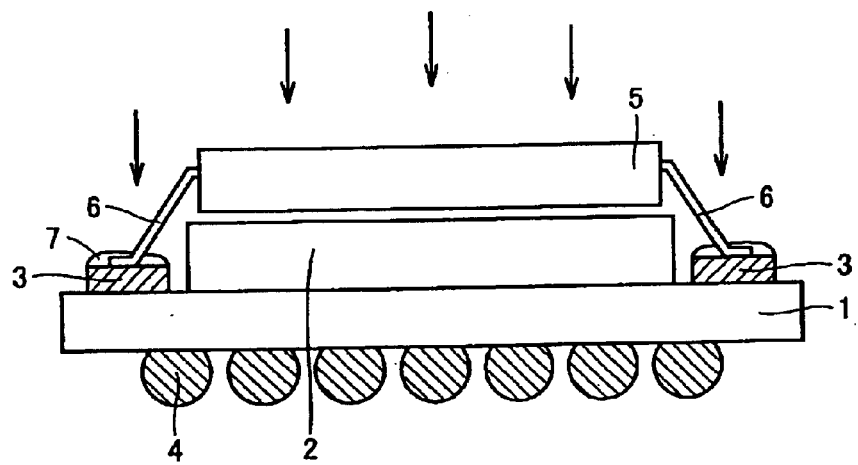
FIG. 34 is a cross section showing a process performed after the process illustrated in FIG. 33 in the seventh embodiment.

After that, the melted solder is cooled down and bonded portions 7 are formed. As shown in FIG. 34, the stacked semiconductor device in which memory IC 5 is stacked on logic IC 2 is completed.

In the method of manufacturing the stacked semiconductor device, fluxes 20*b* and 20*c* are supplied to the portions to be in contact with lands 3 in solder balls 30 and external leads 6 of the memory IC.

At the time of performing predetermined heat treatment to melt solder balls 30, fluxes 20*b* and 20*c* are therefore suppressed from flowing from one land to another land.

Moreover, two solder balls 30 each having a predetermined size are supplied to each of the plurality of lands 3. Thus, solder of a predetermined amount is sufficiently supplied to each of the plurality of lands 3.

As a result, solder balls of a predetermined sufficient amount are melted reliably on lands 3 so that external leads 6 of memory IC 5 and lands 3 can be bonded to each other more reliably.

Eighth Embodiment

A case of supplying solder paste to an external lead by transfer will now be described as an example.

Figure 35:
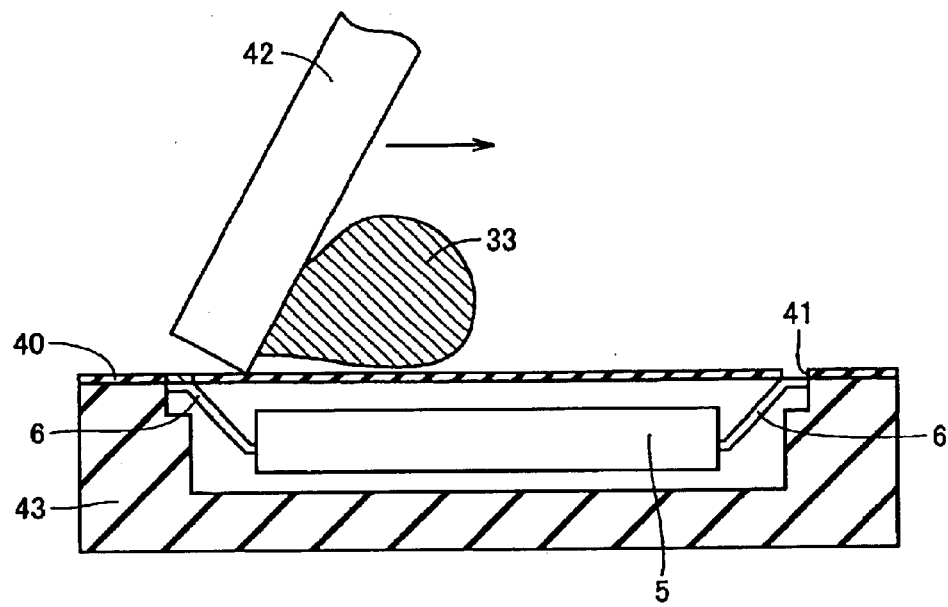
FIG. 35 is a cross section showing a process in a method of manufacturing a semiconductor device according to an eighth embodiment of the present invention.

First, as shown in FIG. 35, memory IC 5 is mounted on a predetermined jig 43 so that the contact face which comes into contact with lands 3 in external leads 6 of memory IC 5 faces upward. A predetermined mask 40 for printing is disposed so as to cover memory IC 5.

In mask 40 for printing, a mask opening 41 is formed in a position corresponding to each of the plurality of external leads 6.

By leveling solder paste 33 with a squeegee 42 for printing, solder paste 33 is supplied to the contact face of external lead 6 via mask opening 41.

Figure 36:
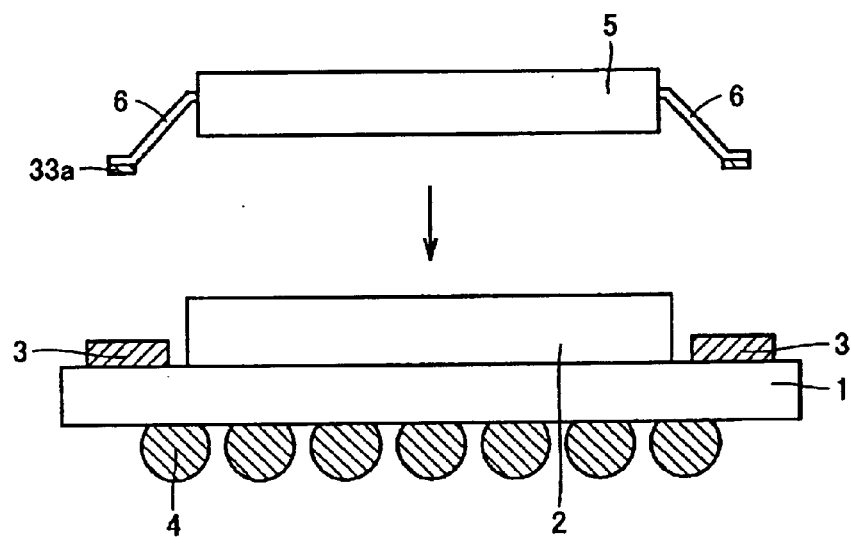
FIG. 36 is a cross section showing a process performed after the process illustrated in FIG. 35 in the eighth embodiment.

Subsequently, as shown in FIG. 36, memory IC 5 to which solder paste 33*a* is supplied is disposed on logic IC 2 in the first stage, and each of the plurality of external leads 6 comes into contact with each of the plurality of corresponding lands 3.

Figure 37:
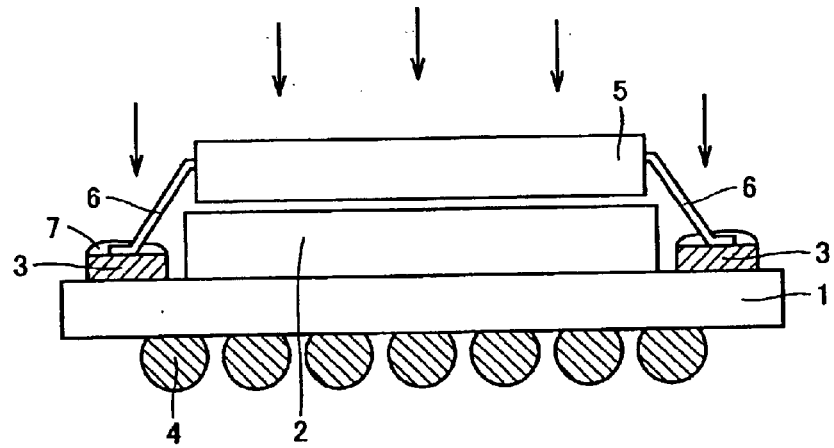
FIG. 37 is a cross section showing a process performed after the process illustrated in FIG. 36 in the eighth embodiment.

By performing predetermined heat treatment at a temperature higher than the melting point of solder, solder paste 33*a* is melted so that external leads 6 of memory IC 5 and lands 3 are bonded to each other. After that, the melted solder is cooled down and bonded portions 7 are formed. As shown in FIG. 37, the stacked semiconductor device in which memory IC 5 is stacked on logic IC 2 is completed.

In the method of manufacturing the stacked semiconductor device, solder paste 33*a* is supplied to the contact face of external lead 6 via mask opening 41 formed in flat-shaped mask 40 for printing.

With the configuration, as compared with the case where solder paste applied in a recess, a groove, or the like is supplied to external leads by transfer as in the conventional technique, the following effects can be obtained.

Figure 38:
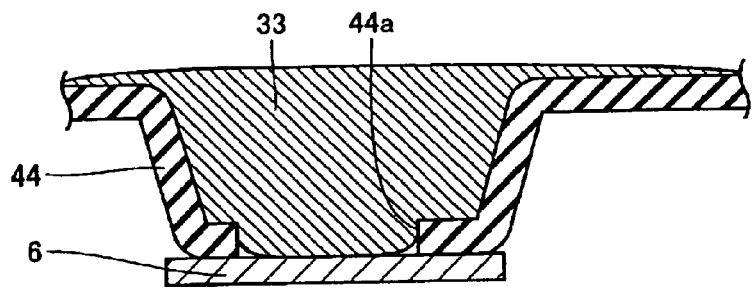
FIG. 38 is a first partly enlarged cross section to be compared for describing effects in the eighth embodiment.

As shown in FIG. 38, for example, in the case of supplying the solder paste applied in a recess or the like in a mask 44 to external lead 6, first, the portion of an opening 44a formed in the bottom of the recess comes into contact with external lead 6.

After that, solder paste 33 is leveled with, for example, a squeegee (not shown). Solder paste 33 filled in the recess is supplied to the contact face of external lead 6 via opening 44a.

Figure 39:
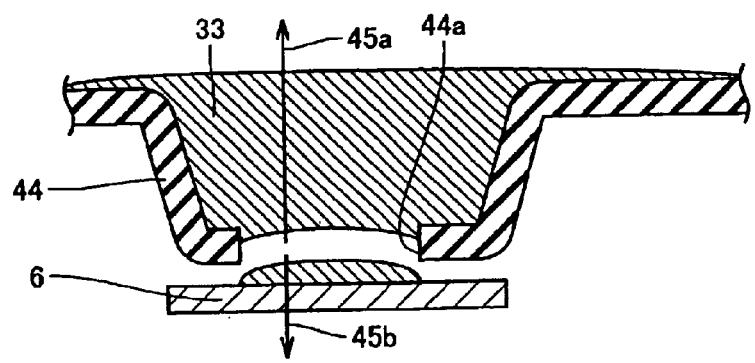
FIG. 39 is a second partly enlarged cross section to be compared for describing effects in the eighth embodiment.

As shown in FIG. 39, mask 44 is taken away from external lead 6. In a force acting on the solder paste supplied to external lead 6, a force 45a acting on the side of mask 44 tends to be larger than a force (adhesion) 45b acting on the side of external lead 6.

Consequently, after mask 44 is taken away from external lead 6, only the solder paste as a part of the solder paste supplied via opening 44a remains on the contact face of external lead 6.

As a result, the amount of the solder paste supplied to the contact face of external lead 6 becomes insufficient and there are cases that external leads 6 and lands 3 are not bonded to each other securely.

Figure 40:
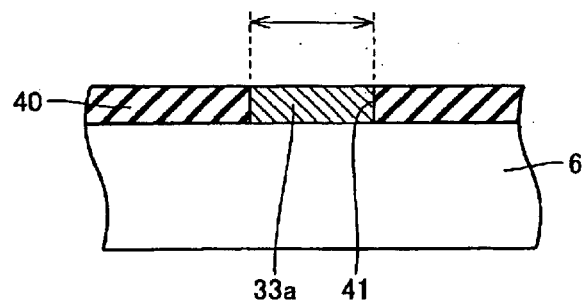
FIG. 40 is a first partly enlarged cross section for describing effects in the eighth embodiment.

On the other hand, in the above-described method, as shown in FIG. 40, solder paste 33a is applied in correspondence with the thickness of mask 40 for printing into mask opening 41 formed in flat-shaped mask 40 for printing, and excessive solder paste does not exist on mask 40 for printing.

Figure 41:
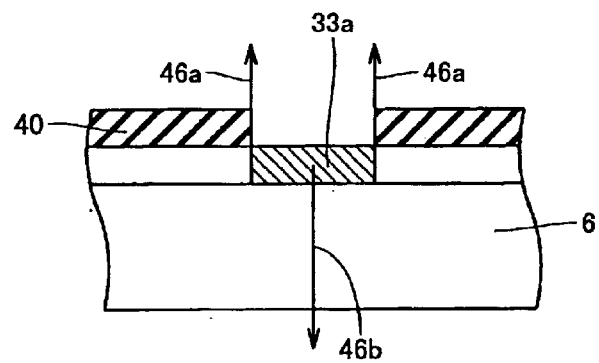
FIG. 41 is a second partly enlarged cross section for describing effects in the eighth embodiment.

When mask 40 for printing is taken away from external lead 6, as shown in FIG. 41, in the force acting on the solder paste supplied to external lead 6, a force (adhesion) 46b acting on the side of external lead 6 becomes larger than a force 46a acting on the side of mask 40 for printing.

Consequently, after mask 40 for printing is taken away from external lead 6, solder paste 33a of the amount corresponding to the size and thickness of mask opening 41 is supplied to the contact face of external lead 6.

As a result, the solder paste of the predetermined amount is supplied to the contact face of external lead 6 with reliability, and external leads 6 and lands 3 can be bonded to each other securely.

In the above-described method, the case of supplying the solder paste to the contact face of external lead 6 via mask opening 41 to memory IC 5 mounted on predetermined jig 43 so that the contact face of external lead 6 faces upward has been described.

Figure 42:
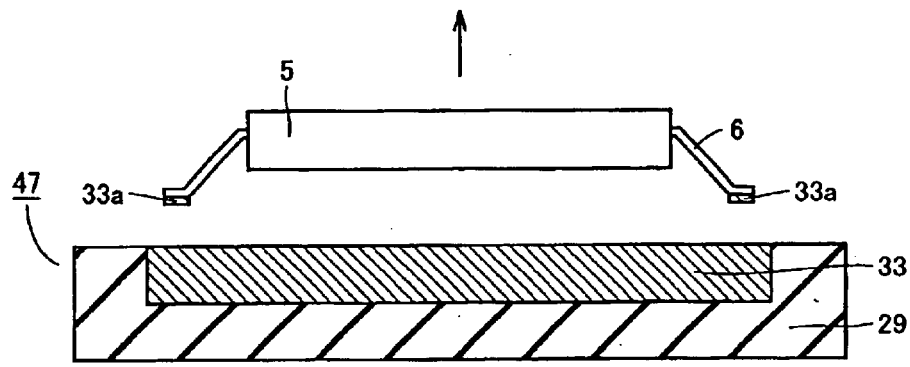
FIG. 42 is a partly enlarged cross section showing a process in a method of manufacturing a semiconductor device according to a modification of the eighth embodiment.

Alternately, for example, a solder paste supplying apparatus 47 shown in FIG. 42 may be provided with the function of supplying the solder paste corresponding to the size of the mask opening and thickness of the mask for printing to the contact face of the external lead, and solder paste 33a of the predetermined amount may be supplied to the contact face of external lead 6 by using solder paste supplying apparatus 47.

Ninth Embodiment

A case of forming a solder plating layer having a predetermined thickness on each land will be described as an example.

Figure 43:
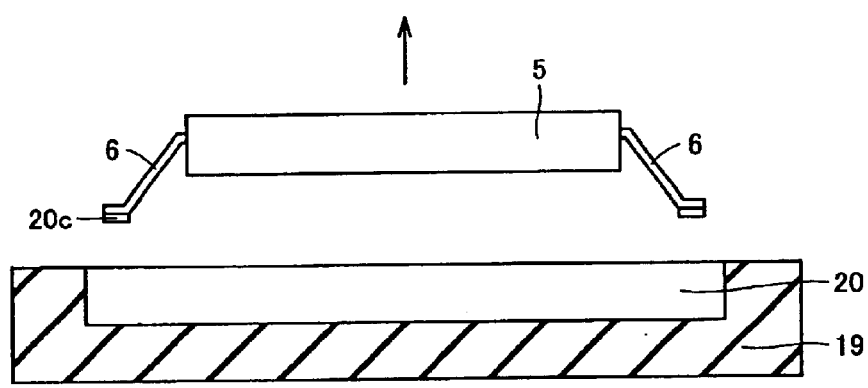
FIG. 43 is a cross section showing a process in a method of manufacturing a semiconductor device according to a ninth embodiment of the present invention.

As shown in FIG. 43, by making external leads 6 of memory IC 5 in the second stage come into contact with flux 20 in vessel 19, flux 20c is supplied to the contact face of each external lead 6.

Figure 44:
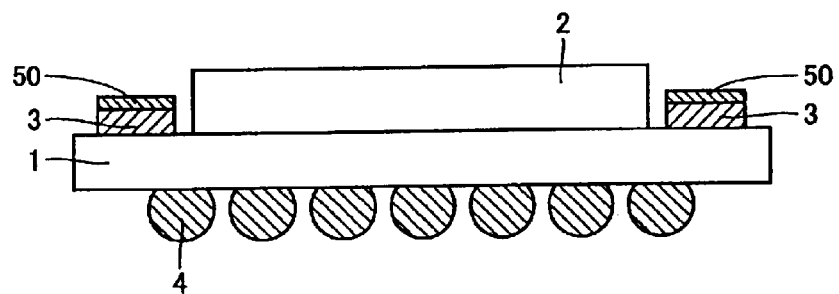
FIG. 44 is a cross section showing a process performed after the process illustrated in FIG. 43 in the ninth embodiment.

On the other hand, as shown in FIG. 44, on the surface of each of the plurality of lands 3, for example, a solder plating layer 50 having a thickness of about 100 μm is formed by electroplating.

Figure 45:
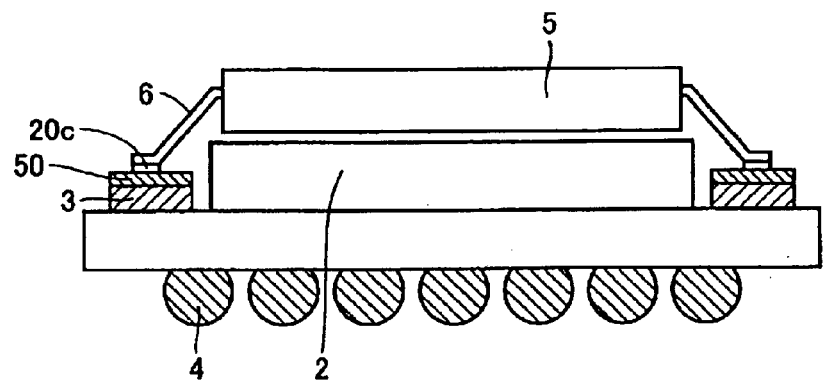
FIG. 45 is a cross section showing a process performed after the process illustrated in FIG. 44 in the ninth embodiment.

Subsequently, as shown in FIG. 45, memory IC 5 having external leads 6 to which flux 20c is supplied is mounted on logic IC 2 in the first stage, and the plurality of external leads 6 come into contact with the plurality of corresponding lands 3.

By performing predetermined heat treatment at a temperature higher than the melting point of solder, solder plating layer 50 is melted so that external leads 6 of memory IC 5 and lands 3 are bonded to each other.

Figure 46:
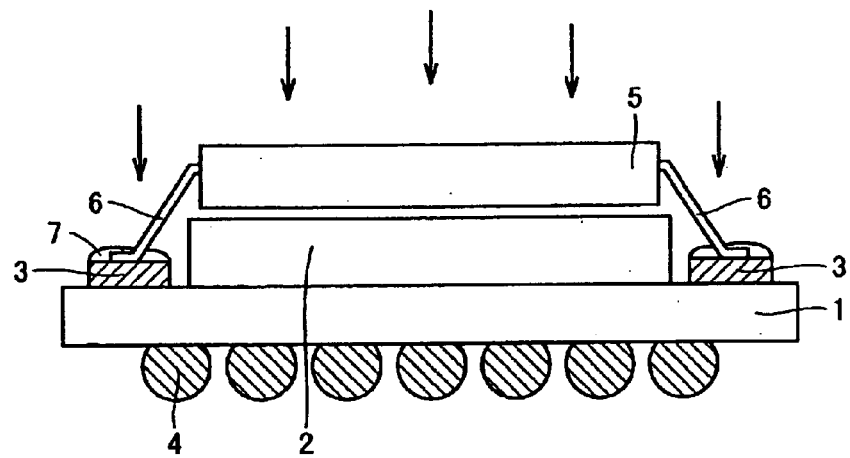
FIG. 46 is a cross section showing a process performed after the process illustrated in FIG. 45 in the ninth embodiment.

After that, the melted solder is cooled down and bonded portions 7 are formed. As shown in FIG. 46, the stacked semiconductor device in which memory IC 5 is stacked on logic IC 2 is completed.

In the method of manufacturing the stacked semiconductor device, solder plating layer 50 having a predetermined thickness is formed on each of the plurality of lands 3. Consequently, solder of a predetermined amount is supplied to each of the plurality of lands 3 with reliability.

As a result, by performing predetermined heat treatment to melt the solder positioned on each land 3, external leads 6 of memory IC 5 and lands 3 can be bonded to each other securely.

In the stacked semiconductor device in each of the foregoing embodiments, a two-layer (two-stage) type in which memory IC 5 is stacked on logic IC 2 has been described as an example.

Figure 47:
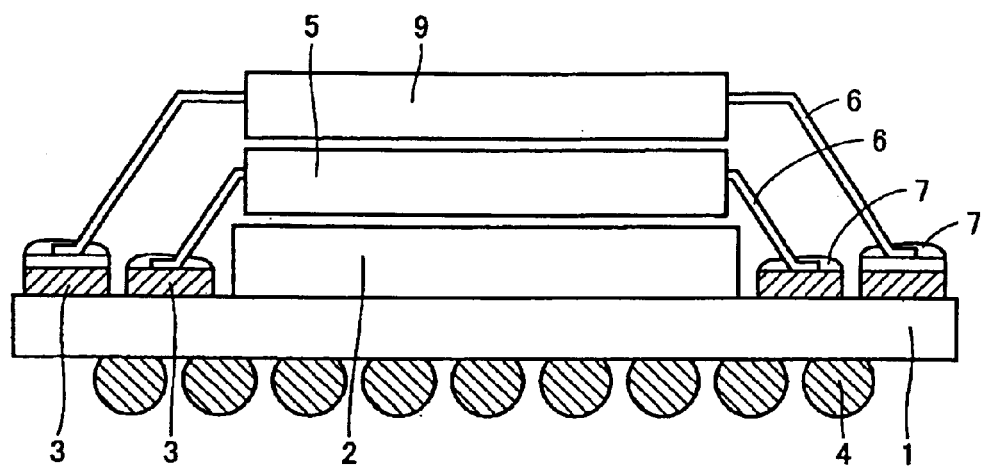
FIG. 47 is a cross section showing a modification of a stacked semiconductor device manufactured by using the method of manufacturing a semiconductor device according to any of the embodiments of the present invention.

The manufacturing method is not limited to the two-stage type. For example, as shown in FIG. 47, the present invention can be also applied to the case where a semiconductor device body 9 in the third stage is stacked on memory IC 5 in the second stage.

Although logic IC 2 is used as a semiconductor device body in the first stage and memory IC 5 is used as a semiconductor device body in the second stage as an example, the present invention is not limited to the semiconductor device bodies.

Further, the ball grid array type has been described above as an example in the foregoing embodiments, the present invention is not limited to a stacked semiconductor device of this type. The manufacturing method can be widely applied to a structure such that semiconductor device bodies are stacked on a substrate and at least one of the semiconductor device bodies and a land provided for the substrate are bonded to each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a stacked semiconductor device in which a plurality of semiconductor device bodies each having a predetermined function are stacked on a main surface of a substrate, comprising the steps of:

forming a semiconductor device body on a main surface of a substrate;

forming a plurality of electrodes to be electrically connected to said semiconductor device body on the surface of portions in said substrate positioned around said semiconductor device body;

supplying a solder ball of a predetermined size to each of said plurality of electrodes;

preparing another semiconductor device body having a plurality of external leads to be bonded to said plurality of electrodes;

supplying flux to either said plurality of external leads of said another semiconductor device body or said plurality of electrodes;

after said flux is supplied, disposing said another semiconductor device body on said semiconductor device body and making each of said plurality of electrodes to which said solder balls are supplied come into contact with each of said plurality of corresponding external leads; and performing predetermined heat treatment in a state where said plurality of electrodes and said plurality of external leads are in contact with each other to melt said solder balls, thereby bonding each of said plurality of electrodes with each of said plurality of electrodes.

2. The method of manufacturing a stacked semiconductor device according to claim 1, wherein in the step of supplying said solder balls, a plurality of solder balls are supplied to one electrode.

3. The method of manufacturing a stacked semiconductor device according to claim 2, wherein a recess is preliminarily formed in a position to which said solder ball is supplied in each of said plurality of electrodes.

4. The method of manufacturing a stacked semiconductor device according to claim 1, wherein a recess is preliminarily formed in a position to which said solder ball is supplied in each of said plurality of electrodes.

5. The method of manufacturing a stacked semiconductor device according to claim 1, wherein in the step of supplying said flux, flux is selectively supplied to a position in which said solder ball is supplied in each of said plurality of electrodes.

6. The method of manufacturing a stacked semiconductor device according to claim 1, wherein in the step of supplying said solder ball, flux is preliminarily applied to a portion with which said electrode comes into contact of said solder ball and, in a state where the flux is applied, said solder ball is supplied to each of said plurality of electrodes.

7. The method of manufacturing a stacked semiconductor device according to claim 6, wherein in the step of supplying said solder balls, a plurality of solder balls are supplied to one electrode.

8. A method of manufacturing a stacked semiconductor device in which a plurality of semiconductor device bodies each having a predetermined function are stacked on the main surface of a substrate, comprising the steps of:

forming a semiconductor device body on the main surface of the substrate;

forming a plurality of electrodes electrically connected to said semiconductor device body on the surface of a part in said substrate positioned around said semiconductor device body;

preparing another semiconductor device body having a plurality of external leads bonded to said plurality of electrodes;

supplying a solder paste of a predetermined amount corresponding to a predetermined thickness of a predetermined mask member via the predetermined mask member corresponding to dimensions of said external lead to each of said plurality of external leads in said another semiconductor device body;

after said solder paste is supplied, disposing said another semiconductor device body on said semiconductor device body and making each of said plurality of external leads to which said solder paste is supplied come into contact with each of said plurality of corresponding electrodes; and performing predetermined heat treatment in a state where said plurality of electrodes and said plurality of external leads are in contact with each other to melt said solder paste, thereby bonding each of said plurality of electrodes to each of said plurality of corresponding electrodes.

9. A method of manufacturing a stacked semiconductor device in which a plurality of semiconductor device bodies each having a predetermined function are stacked on the main surface of a substrate, comprising the steps of:

forming a semiconductor device body on the main surface of the substrate;

forming a plurality of electrodes electrically connected to said semiconductor device body on the surface of a part of said substrate positioned around said semiconductor device body;

forming a solder plating layer having a predetermined thickness on each of said plurality of electrodes;

preparing another semiconductor device body having a plurality of external leads bonded to said plurality of electrodes;

supplying flux to either said plurality of external leads or said plurality of electrodes in said another semiconductor device body; after said flux is supplied, disposing said another semiconductor device body on said semiconductor device body and making each of said plurality of corresponding external leads come into contact with each of said plurality of electrodes on each of which said solder plating layer is formed; and performing predetermined heat treatment in a state where said plurality of electrodes and said plurality of external leads are in contact with each other to melt said solder plating layer, thereby bonding each of said plurality of electrodes to each of said plurality of corresponding electrodes.

* * * * *